United States Patent

Bylund et al.

[15] 3,703,668

[45] Nov. 21, 1972

[54] SEMICONDUCTOR DEVICE WITH SEMICONDUCTOR ELEMENTS ARRANGED SIDE BY SIDE AND PROVIDED WITH HOLLOW COOLING BODIES

[72] Inventors: Per-Ake Bylund; Tibor Farkas; Nils Eric Andersson, all of Vasteras, Sweden

[73] Assignee: Allmanna Svenska Elektriska Aktiebolaget, Vasteras, Sweden

[22] Filed: July 9, 1971

[21] Appl. No.: 161,199

Related U.S. Application Data

[63] Continuation-in-part of Ser. No. 121,978, March 8, 1971, abandoned.

[30] Foreign Application Priority Data

March 23, 1970 Sweden ....................3973/70

[52] U.S. Cl..........317/234 R, 317/234 A, 317/234 B, 317/234 G, 165/80

[51] Int. Cl...............................H01l 3/00, H01l 5/00

[58] Field of Search.......317/234A, 234B, 234G, 234 H; 165/80, 105

[56] References Cited

UNITED STATES PATENTS

| | | | |
|---|---|---|---|
| 2,780,757 | 2/1957 | Thornhill et al | 317/234 B |
| 2,917,685 | 12/1959 | Wiegand | 317/234 B |
| 3,502,956 | 3/1970 | Fries et al | 317/234 B |
| 3,586,959 | 6/1971 | Eccles | 317/234 B |

FOREIGN PATENTS OR APPLICATIONS

| | | | |
|---|---|---|---|
| 1,076,237 | 7/1967 | Great Britain | 317/234 B |
| 1,917,285 | 2/1970 | Germany | 317/234 P |

OTHER PUBLICATIONS

Microelectromic Packaging, By Bleher et al, IBM Bulletin, Vol. 12, No. 5, Oct. 1969, page 727.

*Primary Examiner*—John W. Huckert
*Assistant Examiner*—Andrew J. James
*Attorney*—Jennings Bailey, Jr.

[57] ABSTRACT

A semiconductor device comprises semiconductor elements arranged side by side and provided with hollow cooling bodies. The cooling bodies are joined to each other by a connection conduit for the coolant which is flexible and which insulates the cooling bodies from each other electrically. The connection conduit comprises a tube of insulating inorganic material and a bellows of metallic material fixed to each end of the tube.

3 Claims, 3 Drawing Figures

PATENTED NOV 21 1972

3,703,668

Figure 1:
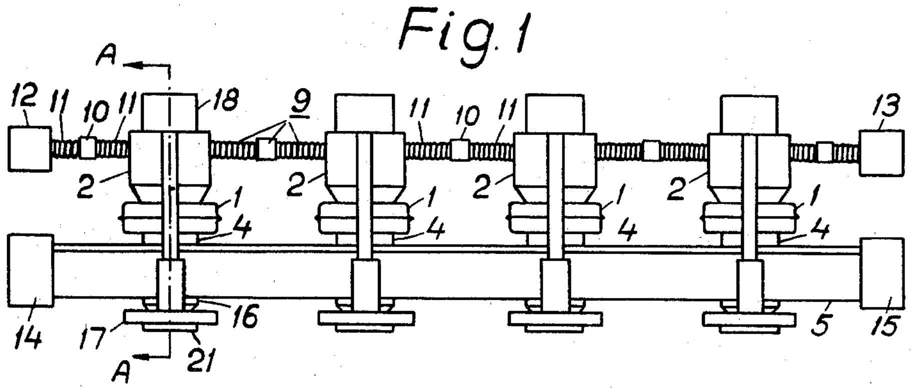

INVENTOR.

PER-AKE BYLUND
BY TIBOR FARKAS
NILS ERIK ANDERSSON
Jennings Bailey, Jr

SEMICONDUCTOR DEVICE WITH SEMICONDUCTOR ELEMENTS ARRANGED SIDE BY SIDE AND PROVIDED WITH HOLLOW COOLING BODIES

This application is a continuation-in-part of application Ser. No. 121,978, filed on Mar. 8, 1971 and now abandoned.

In many semiconductor devices, for example certain rectifier devices, a plurality of semiconductor elements, such as diodes or thyristors, are arranged side by side and provided with hollow cooling bodies with connections for cooling liquid in the form of tubes of rubber or plastic, possibly reinforced with glassfiber cloth, for example. In comparison with rigid connection conducts of metal, these tubes have the advantage of being flexible so that they cannot be broken or cracked, for example at the attachment points to the cooling bodies, if they are subjected to stresses. Another important property of the tubes is that they are electrically insulating. The cooling bodies are usually arranged as connecting bodies for electric current to the semiconductor element and insulated connection conduits thus have the effect of preventing the cooling bodies and thus the semiconductor elements being electrically connected to each other. It is thus possible to connect the semiconductor elements in parallel or in series according to the requirement, with special electric connections.

However, it has been found with the use of rubber and plastic tubing, that considerable difficulties arise in effecting reliable attachments of the tubes to the cooling bodies. The tubes are normally attached to nipples on the cooling bodies by means of tube clamps or some similar union. If the tube loosens from the nipple this can have not only a disastrous effect on the semiconductor element which may be destroyed as a result of overheating, but may also cause great risks of fire if the coolant is combustible material such as oil. There are several cases known where fire has occurred as a result of faults in the connecting cables for coolant in semiconductor devices.

According to the present invention it has been found possible to avoid said disadvantage in the previously known semiconductor devices having connecting cables of rubber or plastic and obtain completely reliable attachment in the cooling bodies. Furthermore, the advantages of a tube or rubber or plastic remain, namely the flexibility and ability to serve as electrical insulating body. The connecting cables according to the invention are also durable and resistant to attack by oil.

The present invention relates to a semiconductor device comprising semiconductor elements arranged side by side, such as diodes or thyristors, which are provided with hollow cooling bodies through which a coolant flows, the cooling bodies being joined to each other by a connection conduit for the coolant, which is flexible and which insulates the cooling bodies from each other electrically, characterized in that the connection conduit comprises a tube of insulating inorganic material, preferably a ceramic material such as porcelain, and a bellows of metallic material fixed to each end of the tube.

The material in the tube is, as mentioned, preferably a ceramic material such as porcelain, steatite or aluminum oxide, but is is also possible to use a tube or glass or other inorganic material.

The metallic material in the bellows may be, for example, steel, brass, aluminum, copper.

The bellows may be fixed to the cooling bodies and to the tube of insulating material by soldering, welding or shrinkage to firm and tight connection joints. Other types of unions giving tight and reliable joints are also possible, for example a screw joint.

It has been found particularly advantageous to assemble the connection conduit with the bellows curved in the transport direction of the cooling liquid. This increases the ability of the connection conduit to take up torsional stress.

The present invention has been found invaluable, for example in rectifier devices comprising a plurality of semiconductor elements designed for double-sided cooling and located in substantially the same plane, these being arranged on one side of a common cooling means in the form of a hollow bar through which a coolant flows, each of the semiconductor elements being arranged in pressure contact between the cooling means arranged on each side. By using connecting conduits according to the invention in such rectifier devices, it is possible for each semiconductor to achieve a desired pressure in the contact surface between the semiconductor element and its cooling means, quite irrespective of the pressure desired for the rest of the semiconductor elements, and still achieve an extremely compact construction of the rectifier devices.

Figure 2:
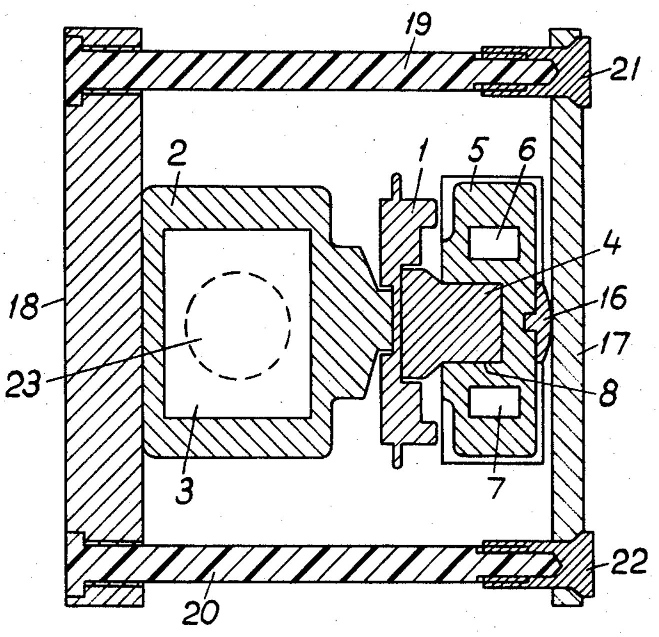
Figure 3:
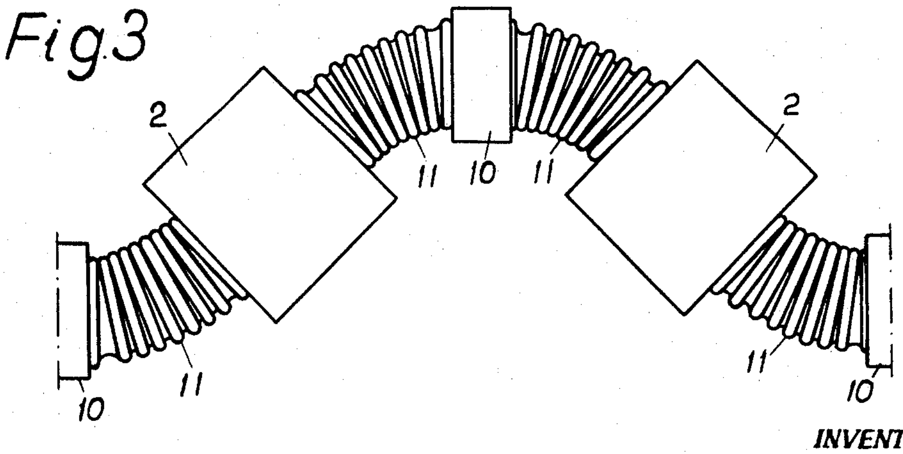

The invention will be further explained by describing a number of embodiments with reference to the accompanying drawings, in which FIG. 1 is a side view of a semiconductor device according to the invention with straight connection conduits, FIG. 2 a section A — A through the center of a semiconductor element and FIG. 3 is a view from above of the semiconductor device according to the invention with curved connection conduit.

The semiconductor elements, which may be diodes or thyristors, are sealed conventionally in flat boxes. On one side of each element a cooling body 2 of copper is arranged in good electric and thermal pressure contact with the element. The cooling body has a hollow 3 for coolant. On the other side of the element is an insert 4 of copper and a cooling means in the form of a bar 5 of light metal alloy which has two cooling channels 6 and 7 for coolant. The insert 4 serves as electric and thermal transfer member from the cooling bar to the semiconductor element and is pressed into a recess 8 in the bar in order to obtain the greatest possible transfer surface between the insert and the bar. The bar 5 serves as common current collector for the four semiconductor elements. Each of the cooling bodies 2 serves as current connection body for the respective semiconductor element on the other side of the semiconductor elements.

In the embodiment shown in FIGS. 1 and 2 the cooling bodies 2 are in communication with each other by means of straight connection conduits 9 for coolant, each of which consists of a tube 10 of porcelain and a bellows 11 of stainless steel at each end of the tube. The space 3 has rectangular cross-section within the cooling body. The openings 23 to the space on opposite walls of the cooling body are circular. The bellows are fixed to the openings of the cooling body with copper-silver solder. The porcelain tube and bellows, both with circular hollows, are also fixed to each other with copper-silver solder. The outer cooling bodies 2 are connected in a corresponding manner to connection bodies 12 and 13 for connection of coolant conduits. The corresponding connection bodies on the bar 5 are designated 14 and 15. The bar 5 is provided outside each semiconductor element with a body 16 either pressed or screwed in, the end of which facing away from the bar is a spherical cap. A yoke 17 of spring steel is provided with a correspondingly spherical recess and abuts the body 16. Certain freedom of movement between yoke and bar is thus obtained and the semiconductor element is thus protected from oblique stresses. A yoke 18 abuts each cooling body 2. The yokes are pressed together by bolts 19 and 20 with nuts 21 and 22. The bolts are made of insulating material, for example glassfiber-reinforced polyester plastic. In the case shown oil is used as coolant.

FIG. 3 shows an embodiment of the invention in which the connection conduit 9 is assembled with the bellows 11 curved between the cooling bodies 2 of the semiconductor elements and the porcelain tube 10. In the example shown in FIG. 3 the cooling bodies of two neighboring semiconductor elements are arranged at an angle to each other. Assembling the connection conduit with curved bellows decreases the risk of ruptures in joints between bellows and cooling body or between bellows and porcelain tube upon torsional stress perpendicular to the direction of transport of the coolant.

Connection conduits assembled according to FIG. 3 may of course be used in the embodiment shown in FIGS. 1 and 2 of a semiconductor device according to the invention. The only difference will be that the straight connection conduits are replaced by curved conduits and that the cooling bodies are arranged at an angle to each other.

In the device according to FIG. 1 the cooling bar 5 which serves as common current collector for the semiconductor elements may be replaced by cooling bodies 2 and connection conduits 9 in the same way as is shown for the cooling of the other side of the semiconductor elements. Each semiconductor element will then be completely electrically insulated from the other semiconductor elements and complete freedom as regards the electric connection is achieved.

We claim:

1. Semiconductor device comprising semiconductor elements arranged side by side which are provided with hollow cooling bodies through which a coolant flows, a connection conduit for coolant joining the cooling bodies to each other, said connection conduit being flexible and insulating the cooling bodies from each other electrically, in which the connection conduit comprises a tube of insulating inorganic material and a bellows of metallic material fixed to each end of the tube.

2. Semiconductor device according to claim 1, in which the bellows is bent in the direction of transport of the coolant.

3. Semiconductor device according to claim 1, which comprises a rectifier means comprising a plurality of semi-conductor elements designed for double-sided cooling and located in substantially the same plane, the cooling bodies and connection conduits pertaining to these elements being arranged on one side of the semi-conductor elements, a common cooling means, the semiconductor elements being arranged on the other side on said common cooling means, said common cooling means comprising a hollow bar through which a coolant flows and a compression member opposite each semi-conductor element to press the cooling body of the element and the cooling bar towards each other.

* * * * *